(12) United States Patent
Kim et al.

(10) Patent No.: US 7,973,309 B2
(45) Date of Patent: Jul. 5, 2011

(54) TEG PATTERN FOR DETECTING VOID IN DEVICE ISOLATION LAYER AND METHOD OF FORMING THE SAME

(75) Inventors: Tae-Gyun Kim, Seoul (KR); Dong-Suk Shin, Gyeonggi-do (KR); Joo-Won Lee, Gyeonggi-do (KR); Ha-Jin Lim, Seoul (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 157 days.

(21) Appl. No.: 12/435,161

(22) Filed: May 4, 2009

(65) Prior Publication Data

US 2009/0283764 A1 Nov. 19, 2009

(30) Foreign Application Priority Data

May 15, 2008 (KR) ......................... 10-2008-0045074

(51) Int. Cl.
*H01L 23/544* (2006.01)
(52) U.S. Cl. ................................. 257/48; 257/E23.179
(58) Field of Classification Search .................... 257/48, 257/E23.179
See application file for complete search history.

(56) References Cited

U.S. PATENT DOCUMENTS

| 7,098,049 | B2* | 8/2006 | Hsu et al. ......................... 438/14 |
| 7,416,986 | B2* | 8/2008 | Zhu et al. ........................ 438/700 |
| 2005/0104063 | A1 | 5/2005 | Hsu et al. |

FOREIGN PATENT DOCUMENTS

| JP | 2007-123755 | 5/2007 |
| KR | 10-2005-0067766 | 7/2005 |
| KR | 10-2006-0078920 | 7/2006 |

\* cited by examiner

*Primary Examiner* — Trung Dang
(74) *Attorney, Agent, or Firm* — Muir Patent Consulting, PLLC

(57) ABSTRACT

Provided is a test element group (TEG) pattern for detecting a void in a device isolation layer. The TEG pattern includes active regions which are parallel to each other and extend in a first direction, a device isolation layer that separates the active regions, a first contact that is formed across the device isolation layer and a first one of the active regions that contacts a surface of the device isolation layer, and a second contact that is formed across the device isolation layer and a second one of the active regions that contacts another surface of the device isolation layer.

18 Claims, 5 Drawing Sheets

(a)

(b)

(c)

(d)

(e)

TEG PATTERN FOR DETECTING VOID IN DEVICE ISOLATION LAYER AND METHOD OF FORMING THE SAME

CROSS-REFERENCE TO RELATED PATENT APPLICATION

This application claims priority under 35 U.S.C. §119 to Korean Patent Application No. 10-2008-0045074, filed on May 15, 2008 in the Korean Intellectual Property Office, the disclosure of which is incorporated herein in its entirety by reference.

BACKGROUND

The present inventive concept relates to a pattern for analyzing failures in semiconductor devices and a method of forming the pattern. More particularly, the present inventive concept relates to a test element group (TEG) pattern for detecting voids generated in a device isolation layer and a method of forming the TEG pattern.

SUMMARY

The present inventive concept provides a test element group (TEG) pattern that can electrically detect a leakage current caused by seams or voids in a device isolation layer.

According to an aspect of the present inventive concept, there is provided a TEG pattern for detecting a leakage current caused by a void in a device isolation layer, the TEG pattern comprising: active regions which are parallel to each other and extend in a first direction; a device isolation layer that separates the active regions; a first contact that is formed across the device isolation layer and a first one of the active regions that contacts a surface of the device isolation layer; and a second contact that is formed across the device isolation layer and a second one of the active regions that contacts another surface of the device isolation layer.

According to another aspect of the present inventive concept, there is provided a TEG pattern, comprising: a first active region disposed on a substrate and extending in a first direction; a second active region substantially parallel to the first active region; a device isolation layer disposed between the first and second active regions; a plurality of first contacts, each of the first contacts disposed partially on the first active region and partially on the device isolation layer; and a plurality of second contacts, each of the second contacts disposed partially on the second active region and partially on the device isolation layer.

According to still another aspect of the present inventive concept, there is provided a TEG pattern, comprising: a first active region disposed on a substrate in a serpentine pattern; a second active region disposed on the substrate in a serpentine pattern, wherein the first active region and the second active region are interleaved together; a device isolation layer disposed between the first and second active regions; a plurality of first contacts, each of the first contacts disposed partially on the first active region and partially on the device isolation layer, wherein the first contacts are electrically connected to the first active region; and a plurality of second contacts, each of the second contacts disposed partially on the second active region and partially on the device isolation layer, wherein the second contacts are electrically connected to the second active region.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION

Figure 1:
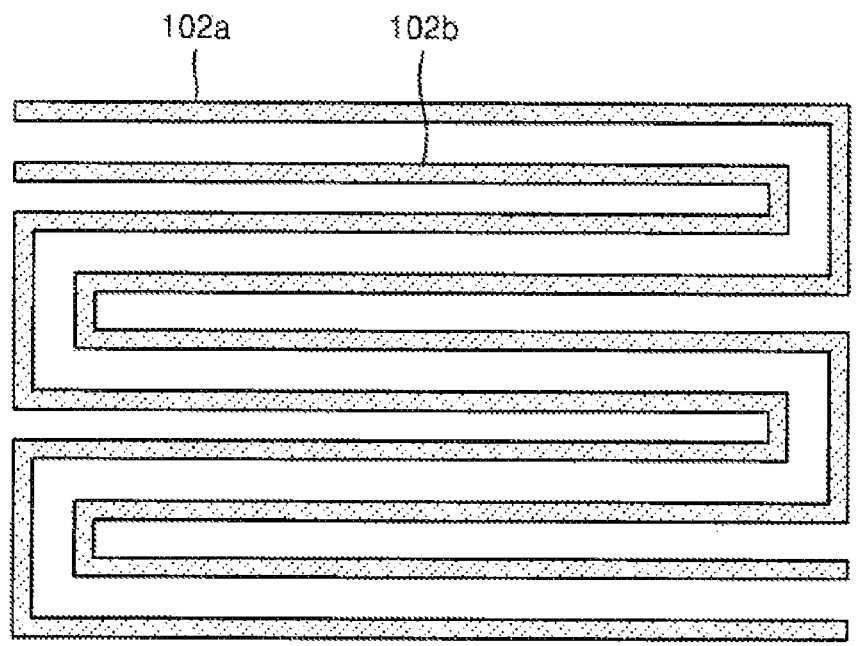
FIG. 1 shows a shape of an active region of a TEG pattern according to an embodiment of the present inventive concept.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to one skilled in the art. In the drawings, the thicknesses of layers and regions may be exaggerated for clarity. Like reference numerals in the drawings denote like elements, and thus redundant descriptions thereof may be omitted.

FIG. 1 shows a shape of an active region of a TEG pattern according to an embodiment of the present inventive concept. Referring to FIG. 1, the TEG pattern includes an active region 102a and an active region 102b, which form a pair. The active regions 102a and 102b may have a line shape that includes bent portions. In other words, the lines may be folded lines. Pads (not shown) are formed on both ends of each of the active regions 102a and 102b. Each pad includes a contact (not shown) for electrically connecting the active regions 102a and 102b to an upper wire. In FIG. 1, the active regions 102a and 102b form a pair of lines, and the line pair may be repeated to form the TEG pattern. For example, the active regions 102a and 102b may have serpentine shapes that are interleaved together.

Figure 2:
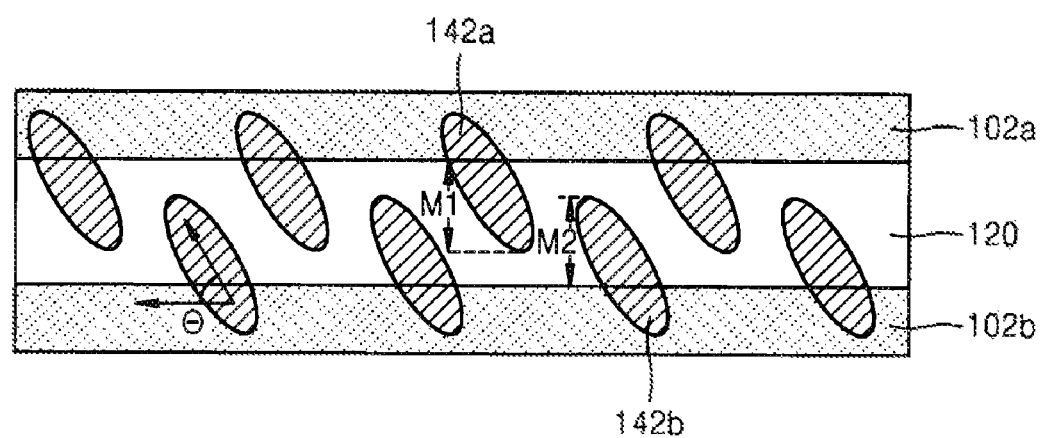
FIG. 2 shows a portion of the TEG pattern of FIG. 1 together with contacts for explaining the positions of the contacts in the TEG pattern of FIG. 1.

FIG. 2 shows a portion of the TEG pattern of FIG. 1 together with contacts for explaining the positions of the contacts in the TEG pattern of FIG. 1. Referring to FIG. 2, a device isolation layer 120 is formed between active regions 102a and 102b having a line shape. A lateral surface of the device isolation layer 120 contacts the active region 102a and the other lateral surface of the device isolation layer 120 contacts the active region 102b. A first contact 142a having an oval shape is formed across the active region 102a and the device isolation layer 120, and a second contact 142b having an oval shape is formed across the active region 102b and the device isolation layer 120. Each of the first and second contacts 142a and 142b extends across a centerline of the device isolation layer 120. Thus, vertical lengths M1 and M2 of the portion of the first and second contacts 142a and 142b disposed on the device isolation layer 120, respectively, are greater than half of the width of the device isolation layer 120. The first and second contacts 142a and 142b are alternately repeated and separated a predetermined distance. In other words, the first and second contacts 142a and 142b form a staggered pattern. In order to increase the detection sensitivity of voids generated in the device isolation layer 120, a distance between the first and second contacts 142a and 142b may be smaller than a distance between the active regions 102a and 102b.

Figure 3:
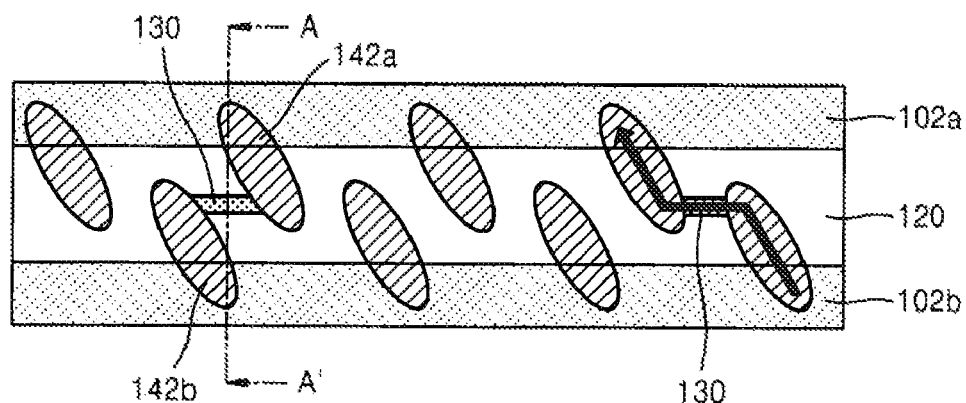
FIG. 3 shows the flow of a current through conductive voids, which are formed in the device isolation layer and are filled with a conductive material, when a voltage is applied to a TEG pattern.

FIG. 3 shows the flow of a current through conductive voids 130, which are formed in the device isolation layer 120 and are filled with a conductive material, when a voltage is applied to a TEG pattern. The conductive voids 130 are formed in a lengthwise direction extending along the active regions 102a and 102b on the central portion of the device isolation layer 120. The conductive voids 130 do not directly connect the active region 102a to the active region 102b on a surface of the device isolation layer 120. However, when the conductive materials are detached from the conductive voids 130 and moved to a different position, the conductive voids 130 can cause a short circuit or a pattern failure.

In FIG. 3, a portion of each of the first and second contacts 142a and 142b passes the central portion of the device isolation layer 120, and thus, the conductive void 130 formed in the central portion of the device isolation layer 120 contacts both the first and second contacts 142a and 142b. Because a portion of the first contact 142a contacts the active region 102a and a portion of the second contact 142b contacts the active region 102b, as indicated by the arrow, a conductive path, which comprises the first contact 142a—the conductive void 130—the second contact 142b and connects the active region 102a to the active region 102b, is formed. The current direction may be opposite to the direction indicated by the arrow.

The first and second contacts 142a and 142b act as a stepping stone that allows the conductive void 130 to connect the active region 102a to the active region 102b. A voltage that drives a current to the TEG pattern is supplied through pads (not shown) connected to the active regions 102a and 102b. The pads (not shown) connected to the active regions 102a and 102b are electrically connected to an interconnection through the first and second contacts 142a and 142b.

In FIG. 3, a lengthy conductive void 130 is depicted as an example. However, the TEG pattern according to the current embodiment, in which a contact simultaneously lies on a device isolation layer and an active region that contacts the device isolation layer, can also be applied to a case in which the conductive void 130 is formed in a circle shape or any other shape.

According to other embodiments of the present inventive concept, as shown in FIG. 2, an angle θ that is formed between an oval-shaped contact and a boundary of an active region may be between 0° and 180°. In other embodiments of the present inventive concept, contacts may have a circular shape or another polygonal shape. Also, the contacts can be formed to cross the active region and the device isolation layer, but, the contacts may not cross a centerline of the device isolation layer. Further, as depicted in FIGS. 2 and 3, the first and second contacts 142a and 142b may be disposed in a zigzag shape so that columns of the first and second contacts 142a and 142b respectively can be slanted with respect to a boundary between the device isolation layer 120 and the active regions 102a and 102b. Alternatively, unlike in FIGS. 2 and 3, the columns of the first and second contacts 142a and 142b can be perpendicular to the boundary between the device isolation layer 120 and the active regions 102a and 102b.

FIGS. 4A through 4G are cross-sectional views taken along line A-A' of FIG. 3 for explaining the formation of a TEG pattern according to an embodiment of the present inventive concept.

Figure 4A:
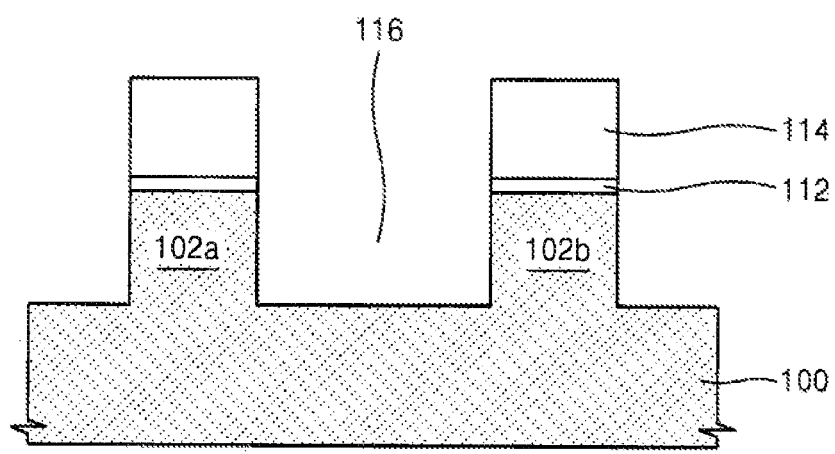
FIGS. 4A through 4G are cross-sectional views for explaining the formation of a TEG pattern according to an embodiment of the present inventive concept.

Referring to FIG. 4A, a pad oxide film 112 and a silicon nitride film 114 are sequentially formed on a semiconductor substrate 100. Afterwards, a trench 116 is formed in the semiconductor substrate 100 using a photography etching process. The trench 116 defines an active region 102a and an active region 102b on both sides of the trench 116.

Figure 4B:
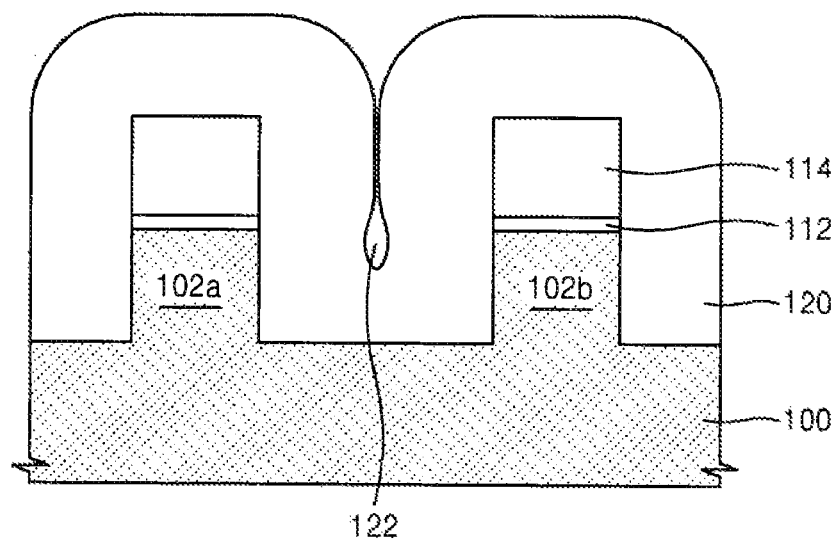

Referring to FIG. 4B, a silicon oxide film 120 is formed in the trench 116. The silicon oxide film 120 can be formed of tetraethly orthosilicate ($O_3$-TEOS) using a sub-atmospheric chemical vapor deposition (SACVD) method. The silicon oxide film 120, formed by filling the trench 116 simultaneously from the bottom and sidewalls of the trench 116, can generate a seam or a void 122.

Figure 4C:
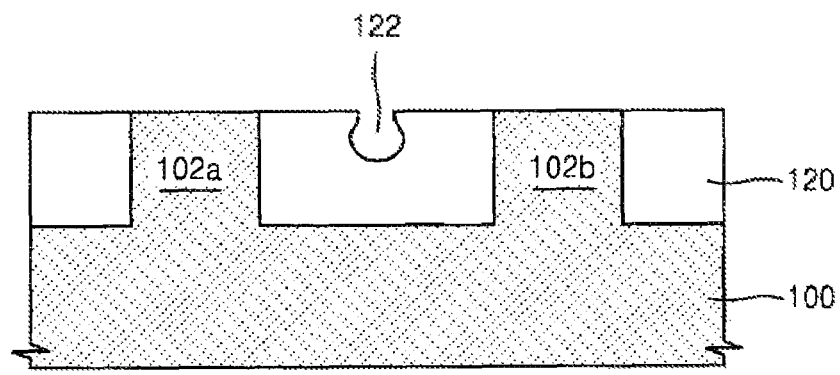

Referring to FIG. 4C, the silicon oxide film 120 on the semiconductor substrate 100 is removed by performing chemical mechanical polishing (CMP) using the silicon nitride film 114 as a mask. The silicon nitride film 114 and the pad oxide film 112 are removed by wet etching. Thus, a layer formed by filling the trench 116 with the silicon oxide film 120, that is, a device isolation layer 120, is formed.

Figure 4D:
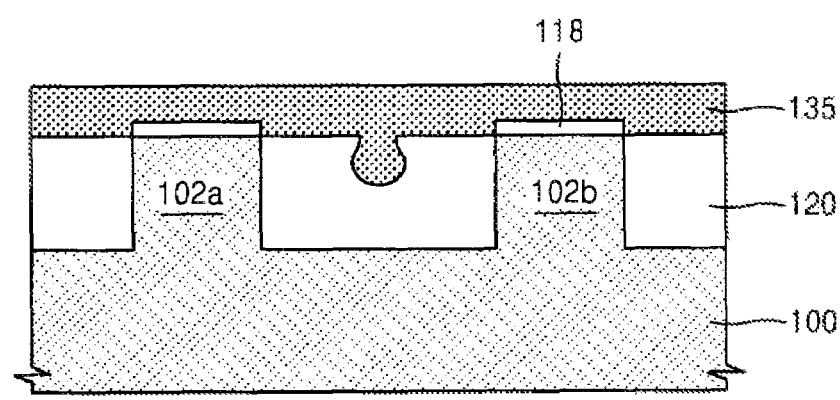

Referring to FIG. 4D, a silicon oxide film 118 and a conductive film 135 are formed on the semiconductor substrate 100 on which the active regions 102a and 102b and the device isolation layer 120 are formed. The silicon oxide film 118 can be formed by oxidizing a surface of the semiconductor substrate 100. The conductive film 135 can be formed of polysilicon, and can be a conductive film for forming a gate electrode. At this point, the void 122 in the device isolation layer 120 is filled with the conductive film 135.

Figure 4E:
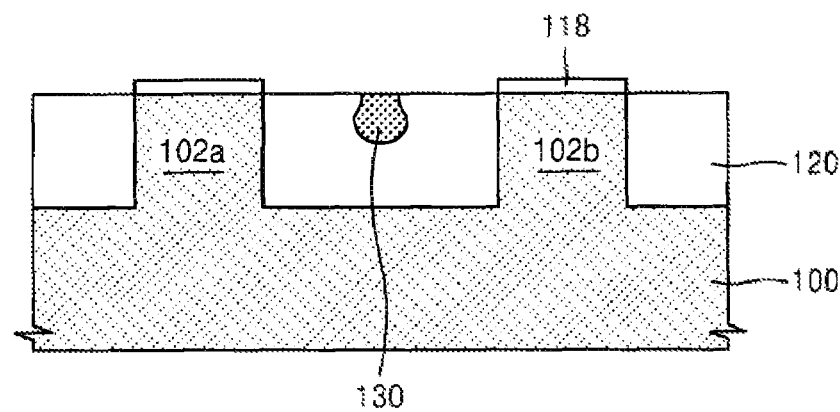

Referring to FIG. 4E, the conductive film 135 on the semiconductor substrate 100 is removed by dry etching. At this point, the portion of the conductive film 135 filled in the void 122 remains, and thus, forms the conductive void 130.

Figure 4F:
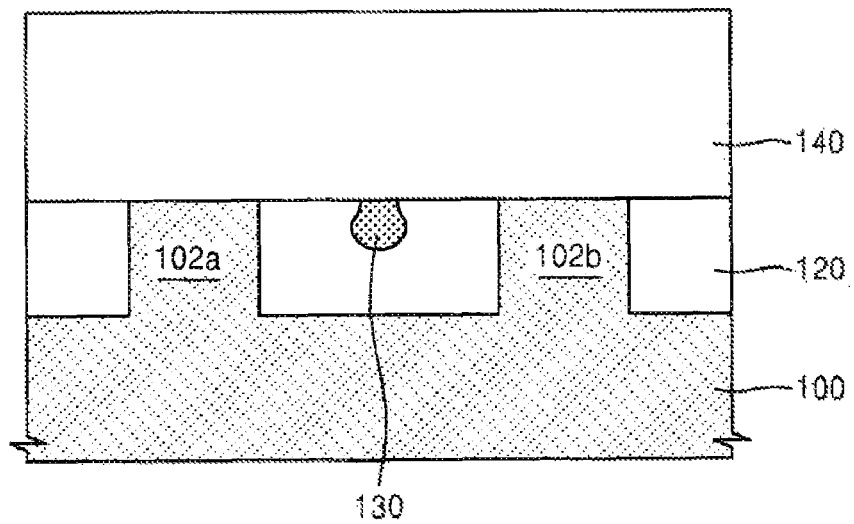

Referring to FIG. 4F, an interlayer insulating layer 140 is formed on the semiconductor substrate 100. The interlayer insulating layer 140 can be a silicon oxide film such as borophosphosilicate glass (BPSG).

Figure 4G:
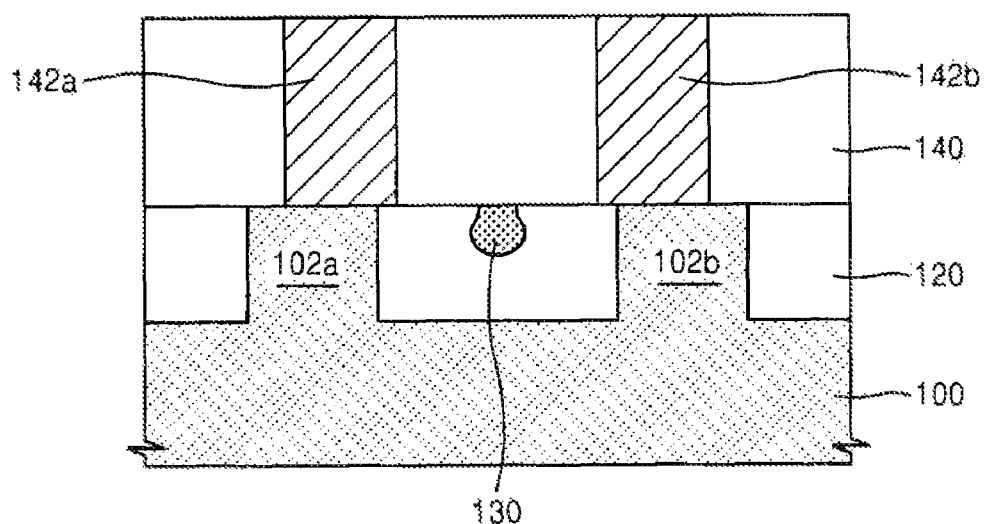

Referring to FIG. 4G, contact holes are formed in the interlayer insulating layer 140, and contacts 142a and 142b are formed by filling the contact holes with a conductive material. The contacts 142a and 142b may be simultaneously formed in one of various processes for forming contacts, such as a bit line contact or a metal contact, in a semiconductor manufacturing process.

The contacts 142a and 142b include a first contact 142a that is formed across the device isolation layer 120 and the active region 102a and a second contact 142b that is formed across the device isolation layer 120 and the active region 102b. The first and second contacts 142a and 142b may be formed in an oval shape, and, in the cross-section of FIG. 7G, the conductive void 130 and the first and second contacts 142a and 142b do not contact each other. However, as shown in FIG. 3, the conductive void 130 contacts the first contact 142a at a position to the front or rear of the cross-section and the conductive void 130 contacts the second contact 142b at a position to the front or rear of the cross-section.

The first and second contacts 142a and 142b electrically connect the conductive void 130, which is filled with a conductive material, to the active regions 102a and 102b. A voltage applied to the active regions 102a and 102b for detecting the conductive void 130 is applied through pads (not shown) connected to the active regions 102a and 102b. It is unnecessary for the first and second contacts 142a and 142b to be connected to an interconnection because the voltage is not applied to the first and second contacts 142a and 142b.

Figure 5:
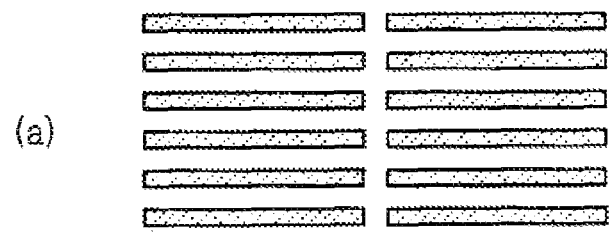
FIG. 5 shows various active regions of a TEG pattern according to embodiments of the present inventive concept.
Figure 5:
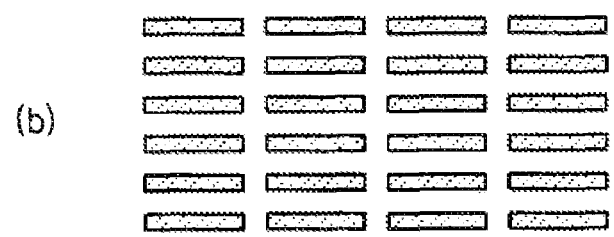
Figure 5:
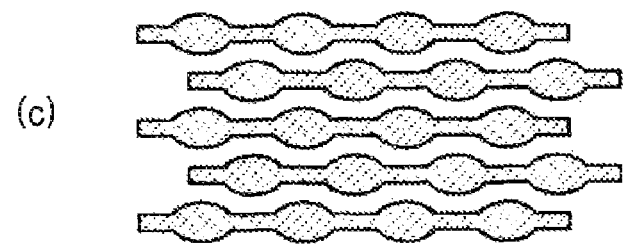
Figure 5:
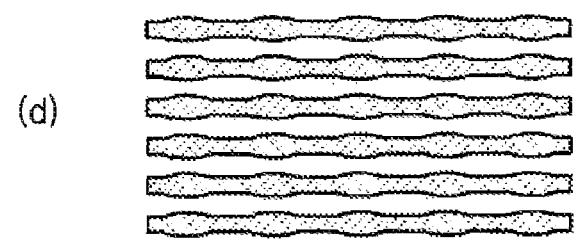
Figure 5:
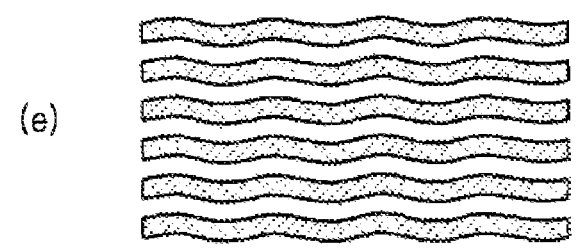

FIG. 5 shows various shapes of active regions of a TEG pattern according to embodiments of the present inventive concept. Referring to FIG. 5, the active regions may have various shapes. The active regions may have line shapes having disconnected segments as shown in (a) and (b) of FIG. 5.

Alternatively, as shown in (c) of FIG. 8, the active regions may have a line shape in which swollen portions are repeated in the lines and the swollen portions of the lines are disposed in a zigzag shape. Also, as shown in (d) of FIG. 8, the active region may have a shape in which swollen portions are repeated in a line and the swollen portions of the lines align with each other. Further, as shown in (e) of FIG. 8, the active region may have a ripple shape.

The shapes of a device isolation layer that separates active regions and the trench for forming the device isolation layer may vary according to the shape of the active region of a TEG pattern. When the trench is filled with an insulating film, the position where seams or voids are generated and the shapes of the seams and the voids may vary according to the shape of the trench. Thus, the active regions of the TEG pattern may be of various shapes so that the generation aspect of voids according to various shapes of the active region of a semiconductor device can be utilized in the void detection.

According to an aspect of the present inventive concept, there is provided a TEG pattern for detecting a leakage current caused by a void in a device isolation layer, the TEG pattern comprising: active regions which are parallel to each other and extend in a first direction; a device isolation layer that separates the active regions; a first contact that is formed across the device isolation layer and a first one of the active regions that contacts a surface of the device isolation layer; and a second contact that is formed across the device isolation layer and a second one of the active regions that contacts another surface of the device isolation layer.

A distance between the first and second contacts may be smaller than a distance between the active regions.

A column that is formed by the first and second contacts may be perpendicular to the first direction. The column that is formed by the first and second contacts may be slanted with respect to the first direction. The first and second contacts respectively may extend across the centerline of the device isolation layer in the first direction.

The first and second contacts may have polygonal shapes or an oval shape.

The active region may have line shape pairs respectively connected to both end portions in the first direction, and at this point, the line shape pairs may be repeated.

The active region may have a plurality of disconnected segments, and the active regions may have a bar shape arrangement due to the disconnected segments. Also, the active region may comprise a first portion having a first width and a second portion having a second width which is greater than the first width, and the first portion and the second portion may be alternately repeated. The active region may have a ripple shape repeated in the first direction.

According to an aspect of the present inventive concept, there is provided a method of forming a TEG pattern for detecting a void in a device isolation layer, the method comprising: forming the device isolation layer that defines active regions, which are parallel to each other and repeatedly extending in a first direction, in a semiconductor substrate; forming a silicon oxide film on the semiconductor substrate on which the device isolation layer is formed; forming a conductive material on the semiconductor substrate on which the silicon oxide film is formed; removing the conductive material formed on the semiconductor substrate; forming an insulating layer on the semiconductor substrate from which the conductive material is removed; and forming a first contact that is connected to the device isolation layer and the active region that contacts a surface of the device isolation layer and a second contact that is connected to the device isolation layer and the active region that contacts another surface of the device isolation layer.

A distance between the first and second contacts may be smaller than a distance between the active regions.

A column that is formed by the first and second contacts may be perpendicular to the first direction.

The column that is formed by the first and second contacts may be slanted with respect to the first direction.

The first and second contacts respectively may extend across the centerline of the device isolation layer in the first direction.

While the present inventive concept has been particularly shown and described with reference to exemplary embodiments thereof, it will be understood by one of ordinary skill in the art that various changes in form and details may be made therein without departing from the spirit and scope of the present inventive concept as defined by the following claims.

What is claimed is:

1. A test element group (TEG) pattern for detecting a leakage current caused by a void in a device isolation layer, the TEG pattern comprising:
   active regions extending in a first direction;
   a device isolation layer separating the active regions;
   a first contact disposed across the device isolation layer and a first one of the active regions, wherein the first one of the active regions contacts a lateral surface of the device isolation layer; and
   a second contact disposed across the device isolation layer and a second one of the active regions, wherein the second one of the active regions contacts another lateral surface of the device isolation layer,
   wherein the first and second contacts extend over a centerline of the device isolation layer in the first direction.

2. The TEG pattern of claim 1, wherein a distance between the first and second contacts is smaller than a distance between the active regions.

3. The TEG pattern of claim 1, wherein a lengthwise direction of at least one of the first and second contacts is perpendicular to the first direction.

4. The TEG pattern of claim 1, wherein a lengthwise direction of at least one of the first and second contacts is slanted with respect to the first direction.

5. The TEG pattern of claim 1, wherein at least one of the first and second contacts has a polygonal shape.

6. The TEG pattern of claim 1, wherein at least one of the first and second contacts has an oval shape.

7. The TEG pattern of claim 1, wherein the active regions comprise a pair of line shapes extending in the first direction.

8. The TEG pattern of claim 7, wherein the pair of line shapes is folded at ends of the line shapes in the first direction.

9. The TEG pattern of claim 8, wherein the active regions comprise a plurality of the pairs of line shapes.

10. The TEG pattern of claim 7, wherein the active regions comprise a plurality of the pairs of line shapes.

11. The TEG pattern of claim 1, wherein the active regions include a plurality of disconnected segments, and the active regions have a bar shape.

12. The TEG pattern of claim 1, wherein the active regions comprise a first portion having a first width and a second portion having a second width which is greater than the first width, and the first portion and the second portion are alternately repeated along a length of the active regions.

13. The TEG pattern of claim 1, wherein the active regions have a ripple shape repeated in the first direction.

14. A test element group (TEG) pattern, comprising:
   a first active region disposed on a substrate and extending in a first direction;

a second active region substantially parallel to the first active region;

a device isolation layer disposed between the first and second active regions;

a plurality of first contacts, each of the first contacts disposed partially on the first active region and partially on the device isolation layer; and a plurality of second contacts, each of the second contacts disposed partially on the second active region and partially on the device isolation layer, wherein each of the first and second contacts extends past a centerline of the device isolation layer.

15. The TEG pattern of claim 14, wherein a lengthwise direction of the first and second contacts is substantially perpendicular to the first direction.

16. The TEG pattern of claim 14, wherein a lengthwise direction of the first and second contacts forms an angle of less than ninety degrees with respect to the first direction.

17. The TEG pattern of claim 13, wherein the first and second active regions each include a plurality of line segments that are physically separated.

18. A test element group (TEG) pattern, comprising:

a first active region disposed on a substrate in a serpentine pattern;

a second active region disposed on the substrate in a serpentine pattern, wherein the first active region and the second active region are interleaved together;

a device isolation layer disposed between the first and second active regions;

a plurality of first contacts, each of the first contacts disposed partially on the first active region and partially on the device isolation layer, wherein the first contacts are electrically connected to the first active region; and a plurality of second contacts, each of the second contacts disposed partially on the second active region and partially on the device isolation layer, wherein the second contacts are electrically connected to the second active region.

* * * * *